US010566720B2

(12) United States Patent
Wang et al.

(10) Patent No.: US 10,566,720 B2
(45) Date of Patent: Feb. 18, 2020

(54) SIMPLE ELECTRICAL CONNECTOR STRUCTURE CONNECTING A RIBBON CABLE AND A PRINTED CIRCUIT BOARD

(71) Applicant: P-Two Industries Inc., Taoyuan (TW)

(72) Inventors: Chien-Chun Wang, Taoyuan (TW); Wen-Lun Wang, Taoyuan (TW)

(73) Assignee: P-Two Industries Inc., Taoyuan (TW)

( * ) Notice: Subject to any disclaimer, the term of this patent is extended or adjusted under 35 U.S.C. 154(b) by 0 days.

(21) Appl. No.: 16/153,112

(22) Filed: Oct. 5, 2018

(65) Prior Publication Data

US 2019/0157785 A1 May 23, 2019

(30) Foreign Application Priority Data

Nov. 17, 2017 (TW) ............................ 106140202 A

(51) Int. Cl.

| | |
|---|---|
| ***H01R 12/79*** | (2011.01) |
| ***H01R 12/70*** | (2011.01) |
| *H01R 12/85* | (2011.01) |
| *H01R 12/73* | (2011.01) |
| *H01R 12/00* | (2006.01) |
| *H05K 1/14* | (2006.01) |
| *H01R 12/72* | (2011.01) |
| *H01R 12/52* | (2011.01) |
| *H01R 12/59* | (2011.01) |
| *H01R 12/77* | (2011.01) |

(52) U.S. Cl.

CPC ......... *H01R 12/79* (2013.01); *H01R 12/7047* (2013.01); *H01R 12/7082* (2013.01); *H01R 12/00* (2013.01); *H01R 12/52* (2013.01); *H01R 12/59* (2013.01); *H01R 12/72* (2013.01); *H01R 12/721* (2013.01); *H01R 12/73* (2013.01); *H01R 12/77* (2013.01); *H01R 12/85* (2013.01); *H05K 1/14* (2013.01)

(58) Field of Classification Search

CPC ........ H01R 12/00; H01R 12/72; H01R 12/52; H01R 12/59; H01R 12/77; H01R 12/79; H01R 12/721; H01R 12/73; H05K 1/14

USPC ......... 439/59, 61, 62, 65, 67, 329, 629, 630, 439/631

See application file for complete search history.

(56) References Cited

U.S. PATENT DOCUMENTS

2002/0031952 A1* 3/2002 Hashimoto ............ H01R 12/83 439/637

2011/0021052 A1* 1/2011 Hirata .................. H01R 12/721 439/325

* cited by examiner

*Primary Examiner* — Abdullah A Riyami

*Assistant Examiner* — Justin M Kratt

(74) *Attorney, Agent, or Firm* — Muncy, Geissler, Olds & Lowe, P.C.

(57) ABSTRACT

A simple connector structure includes a connecting body. The connecting body has a first accommodating space and a second accommodating space. The first accommodating space is matched with a PCB, and the second accommodating space is matched with a ribbon cable body. In addition, the first accommodating space is provided with at least one first conductive part, and the second accommodating space is provided with at least one second conductive part. Therefore, quick connection and labor cost reduction can be effectively achieved through connecting the first accommodating space with the PCB and connecting the second accommodating space with the ribbon cable body.

13 Claims, 10 Drawing Sheets

SIMPLE ELECTRICAL CONNECTOR STRUCTURE CONNECTING A RIBBON CABLE AND A PRINTED CIRCUIT BOARD

This application claims priority from Taiwan Patent Application No. 106140202, filed on Nov. 17, 2017, in the Taiwan Intellectual Property Office, the content of which is hereby incorporated by reference in its entirety for all purposes.

BACKGROUND OF THE INVENTION

1. Field of the Invention

The present invention relates to a simple connector structure, especially referring to a simple connector structure able to reduce labor costs and achieve quick connection.

2. Description of the Related Art

Technology nowadays is changing rapidly, and many technological-related products on the market have an extremely short life cycle. Therefore, in the process of producing technological products, if reducing a step required for production or related materials needed for manufacturing is performed, manufacturing costs that a technology company needs to cover can effectively be reduced.

The conventional ribbon cable connector can only be soldered to a printed circuit board (PCB) with various electronic elements by a soldering process. This is similar to a clamshell connector provided with a flip cover, an insulator, and at least a conductive terminal. The inside of the insulator is provided with a conductor, one side of which is soldered on the PCB, and the other side of which is contacted with a ribbon cable inserted into the opening of the insulator to make electric conductance. Then users can utilize the opening and closing function of the clamshell connector for the purpose of fixing the ribbon cable to the connector or releasing the ribbon cable from the connector.

This is also similar to a connector structure, which is soldered to a conductive terminal set around the connector to achieve electric conductance through a plurality of soldering points set around the hollow in the PCB.

However, the two conventional connectors mentioned above and the PCB can only mutually be electrically conducted and connected through a soldering process. As a result, manufacturing costs needed for producing connectors cannot effectively be reduced.

SUMMARY OF THE INVENTION

The conventional connectors need to be manufactured through a soldering process. Hence, not only is a process required in a manufacturing procedure, leading to wasting superfluous labor costs, but also the connectors can only be dismantled through soldering to proceed with related repair operation in a repairing process.

Therefore, to solve the above-mentioned problems, the present invention provides a simple connector structure, mainly including a connecting body. The connecting body has a first accommodating space and a second accommodating space. The first accommodating space is matched with one side of the PCB. The second accommodating space is matched with a ribbon cable connecting portion provided in a ribbon cable body. The inside of the connecting body is provided with a conductive terminal. The conductive terminal has a first conductive part and a second conductive part. The first conductive part is extended to be disposed on any side or end of the first accommodating space, and the second conductive part is extended to be disposed on any side or end of the second accommodating space. One side of the first conductive part has at least one first protruding part, and one side of the second conductive part has at least one second protruding part. The first accommodating space is connected to one side of the PCB and attached with a face of the PCB through the first protruding part to achieve the functions of electric conductance and fastening. Moreover, the second accommodating space is connected to the ribbon cable connecting portion provided in the ribbon cable body, and the second protruding part is attached with the ribbon cable connecting portion to perform the functions of electric conductance and fastening.

In addition, any side or end of the connecting body is further provided with a fixture element, and the fixture element and the conductive terminal are connected to each other so that the conductive terminal is fastened or loosened by a linkage made by the fixture element through the fixture element performing an open or close action.

Moreover, any side or end of the connecting body further has a connecting part, and the connecting part and the PCB are connected to each other to fix the connecting body to one side of the PCB.

The present invention further provides the other simple connector structure, mainly including a connecting body. Any side or end of the connecting body has an accommodating space. The accommodating space is matched with the thickness of the PCB and the ribbon cable body overlapping each other. The inside of the connecting body is provided with a conductive terminal, and one side of the conductive terminal is extended to have one first conductive part and one second conductive part. The first conductive part and the second conductive part are extended to be disposed on any side or end of the accommodating space. One side of the first conductive part has a first protruding part. One side of the second conductive part has a second protruding part. The first protruding part and the second protruding part are located at a relative position of the up and down side or left and right side of the PCB and the ribbon cable body overlapping each other to fasten the position where the PCB and the ribbon cable body overlap.

Any side or end of the connecting body is further provided with a fixture element, and the fixture element and the conductive terminal are connected to each other so that the conductive terminal is fastened or loosened by a linkage made by the fixture element through the fixture element performing an open or close action.

Furthermore, any side or end of the connecting body is further provided with at least one connecting part, and the connecting part and the PCB are connected to each other to fix the connecting body to one side of the PCB.

To make the above-mentioned purposes, characteristics, and advantages easier to be understood, the following descriptions are explained in detail with embodiments exemplified along with each drawing.

DETAILED DESCRIPTION OF THE ILLUSTRATED EMBODIMENTS

Figure 1:
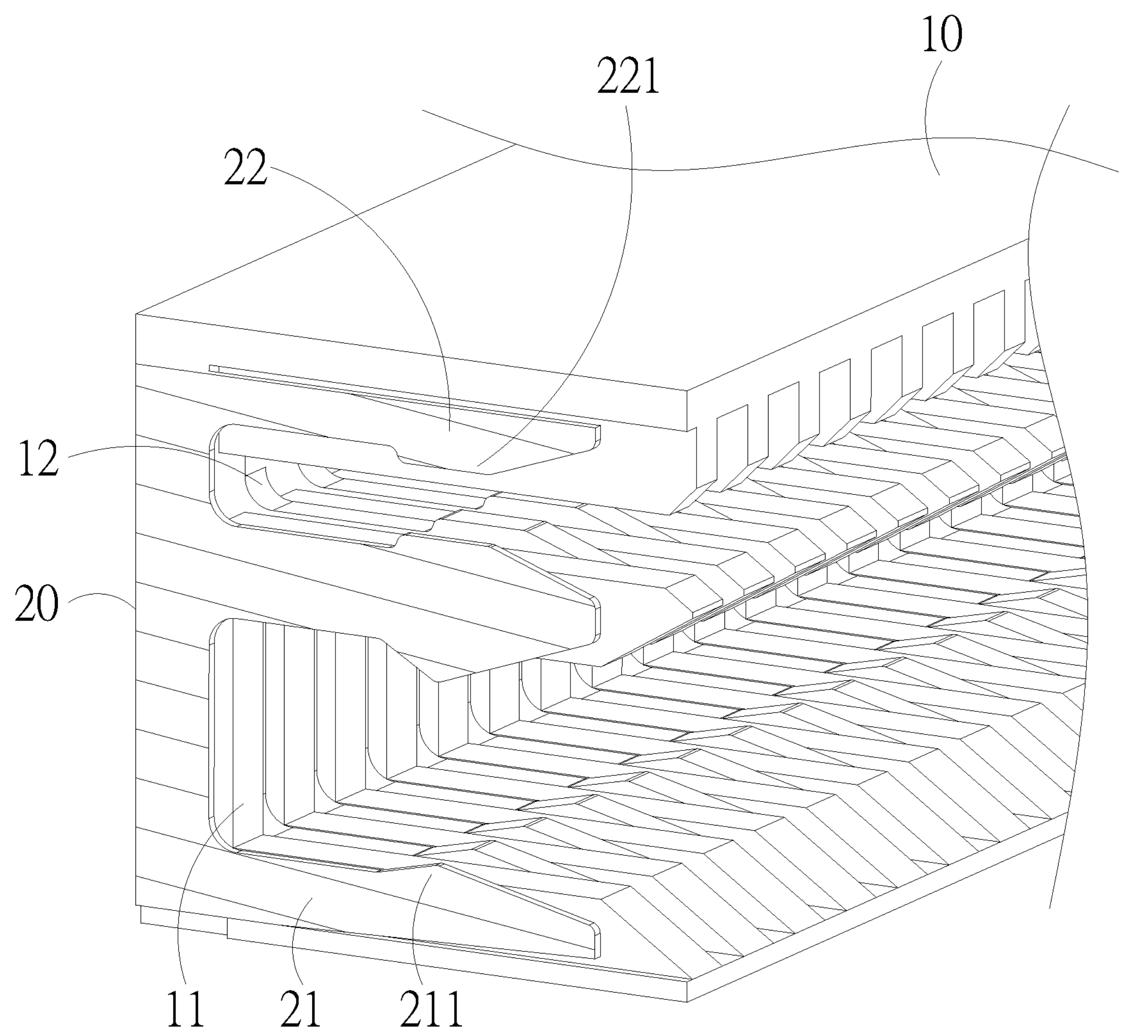
FIG. 1 is a stereogram of the present invention.
Figure 2:
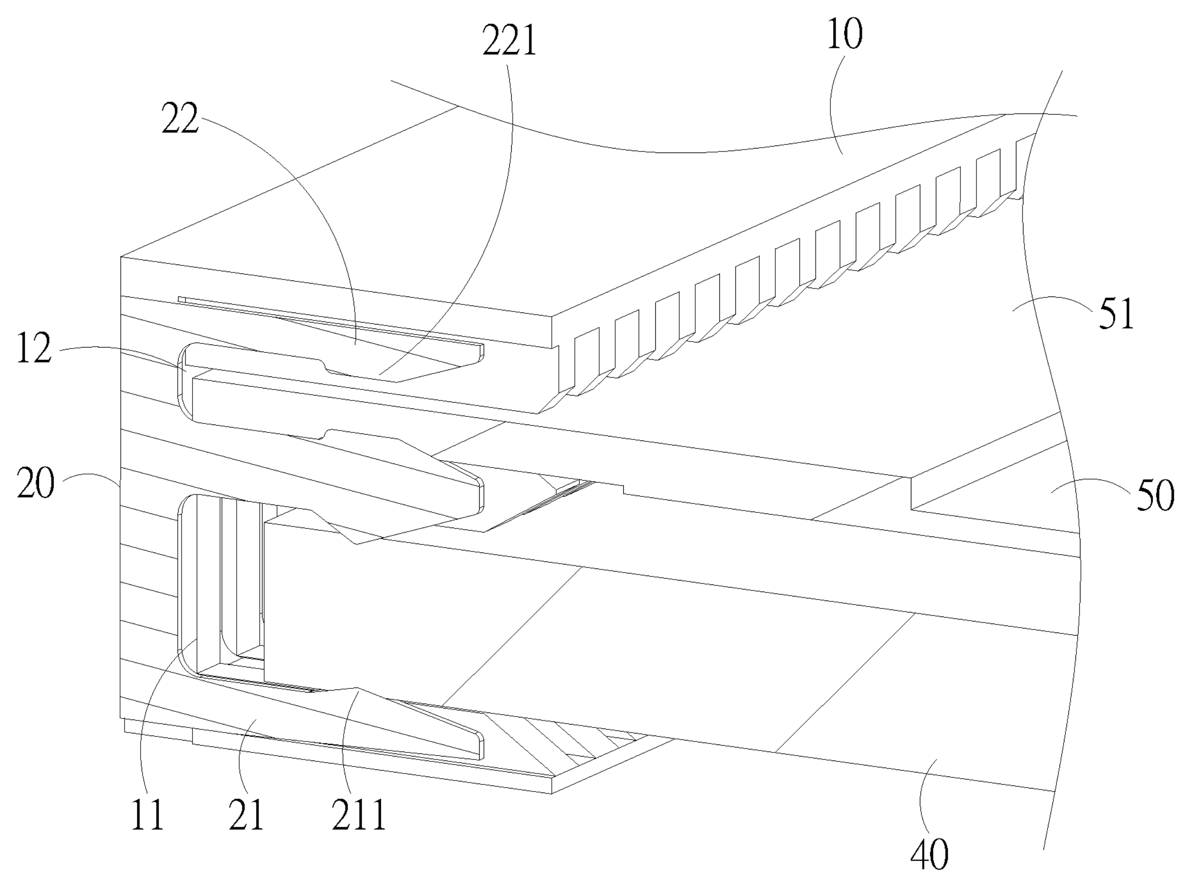
FIG. 2 is a state diagram of the first embodiment of the present invention.

To facilitate the review of the contents of the present invention and the achievable effects, each specific embodiment together with the drawings is described in detail as follows:

Please refer to FIG. 1 and FIG. 2, illustrating the stereogram and the state diagram of the first embodiment of the present invention. As indicated in the drawings, the present invention mainly includes a connecting body 10. The connecting body 10 has a first accommodating space 11 and a second accommodating space 12. The first accommodating space 11 is matched with one side of the PCB 40. The second accommodating space 12 is matched with the ribbon cable connecting portion 51 provided in the ribbon cable body 50. Moreover, the inside of the connecting body 10 is provided with a conductive terminal 20. The conductive terminal 20 has a first conductive part 21 and a second conductive part 22. The first conductive part 21 is extended to be disposed on any side or end of the first accommodating space 11, and the second conductive part 22 is extended to be disposed on any side or end of the second accommodating space 12. In addition, one side of the first conductive part 21 has at least one first protruding part 211, and one side of the second conductive part 22 has at least one second protruding part 221.

Therefore, when the PCB 40 is inserted into the first accommodating space 11, the first protruding part 211 will be attached with a face of the PCB 40. Because of the first conductive part 21 being flexible, when the first protruding part 211 is attached with the PCB 40, the first protruding part 211 will be squeezed toward the inside of the first accommodating space 11 to fix the PCB 40. Moreover, when the ribbon cable body 50 is inserted into the second accommodate space 12 through the ribbon cable connecting portion 51, the second protruding part 221 will be attached with the ribbon cable connecting portion 51. Because of the second conductive part 22 also being flexible, the second protruding part 221 will be also squeezed toward the inside of the second accommodating space 12 to fix the ribbon cable connecting portion 51. In doing so, the functions of mutually electric conductance and clamping can be achieved through the first protruding part 211 provided in the first conductive part 21 being attached with the PCB 40 and the second protruding part 221 provided in the second conductive part 22 being attached with the ribbon cable connecting portion 51.

Figure 3A:
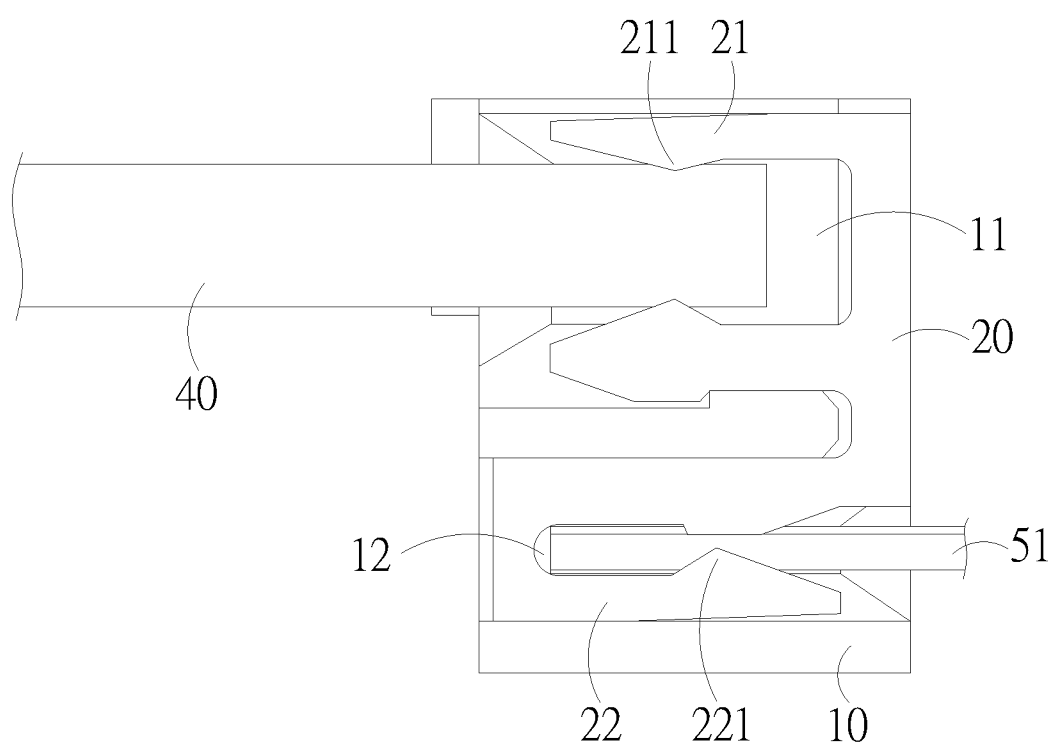
FIG. 3A is a state diagram of the second embodiment of the present invention.

Please refer to FIG. 3A, illustrating the state diagram of the second embodiment of the present invention. As indicated in the drawing, the first accommodating space 11 and the second accommodating space 12 can be disposed on one side or end of the connecting body 10. As indicated in 3A, the first accommodating space 11 is disposed on one side of the connecting body 10, with the opening directing to the left (as indicated in the left side of FIG. 3A). The second accommodating space 12 is disposed on the other side of the connecting body 10, with the opening directing to the right (as indicated in the right side of FIG. 3A). The first conductive part 21 is extended to be disposed on one side or end of the first accommodating space 11, and the PCB 40 is accommodated in the first accommodating space 11. The second conductive part 21 is extended to be disposed on one side or end of the second accommodating space 12, and the ribbon cable connecting portion 51 is accommodated in the first accommodating space 12. Therefore, except that the position where the second accommodating space 12 is disposed is different so that the direction in which the ribbon cable connecting portion 51 needs to be inserted is different, the effects to be expected and the technical characteristics of the structure are identical.

Figure 3B:
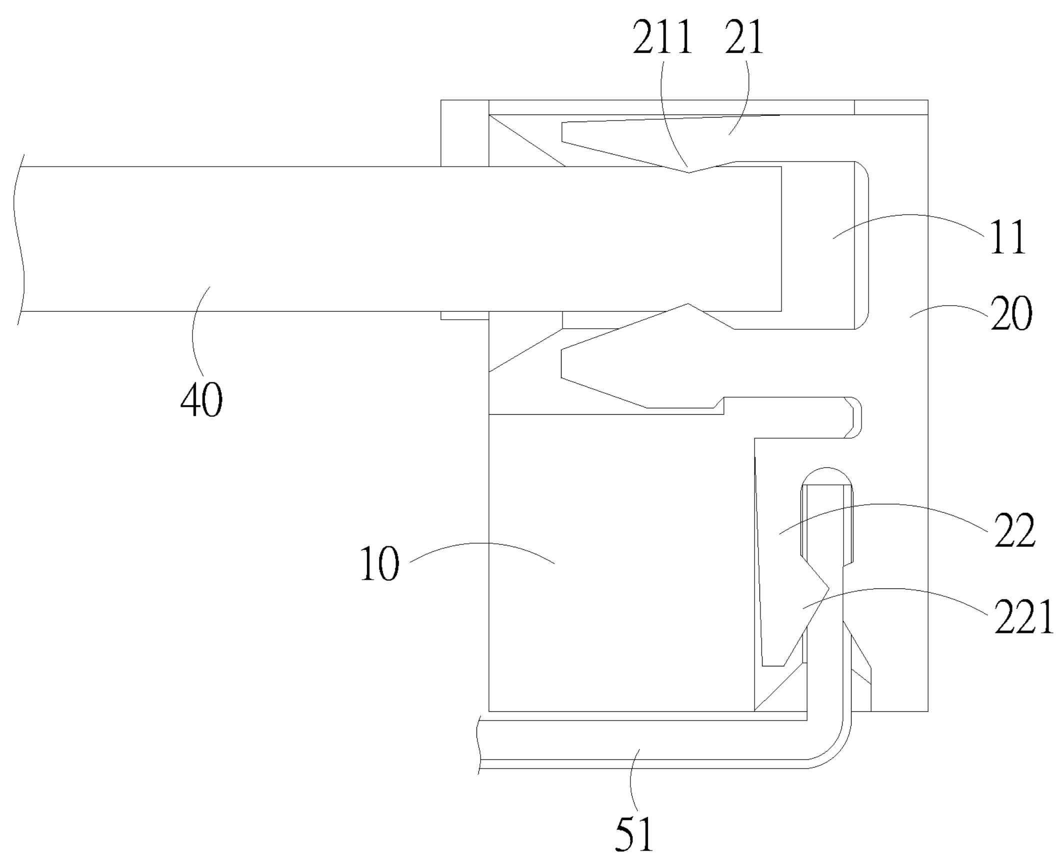
FIG. 3B is a state diagram of the third embodiment of the present invention.

In addition, please refer to FIG. 3B, illustrating the state diagram of the third embodiment of the present invention. The position where the second accommodating space 12 is disposed is changed to the lower side of the connecting body 10, and its opening position is directed downward. However, the second conductive part 22 can also be extended to be disposed on one side or end of the second accommodating space 12, and the ribbon cable connecting portion 51 can be inserted into the second accommodating space 12 from the bottom, or inserted into the second accommodating space 12 in a concave manner. Therefore, it should be known from FIG. 3A and FIG. 3B that the technical features of the present invention are not limited by the positions where the first accommodating space 11 and the second accommodating space 12 are disposed.

Figure 4:
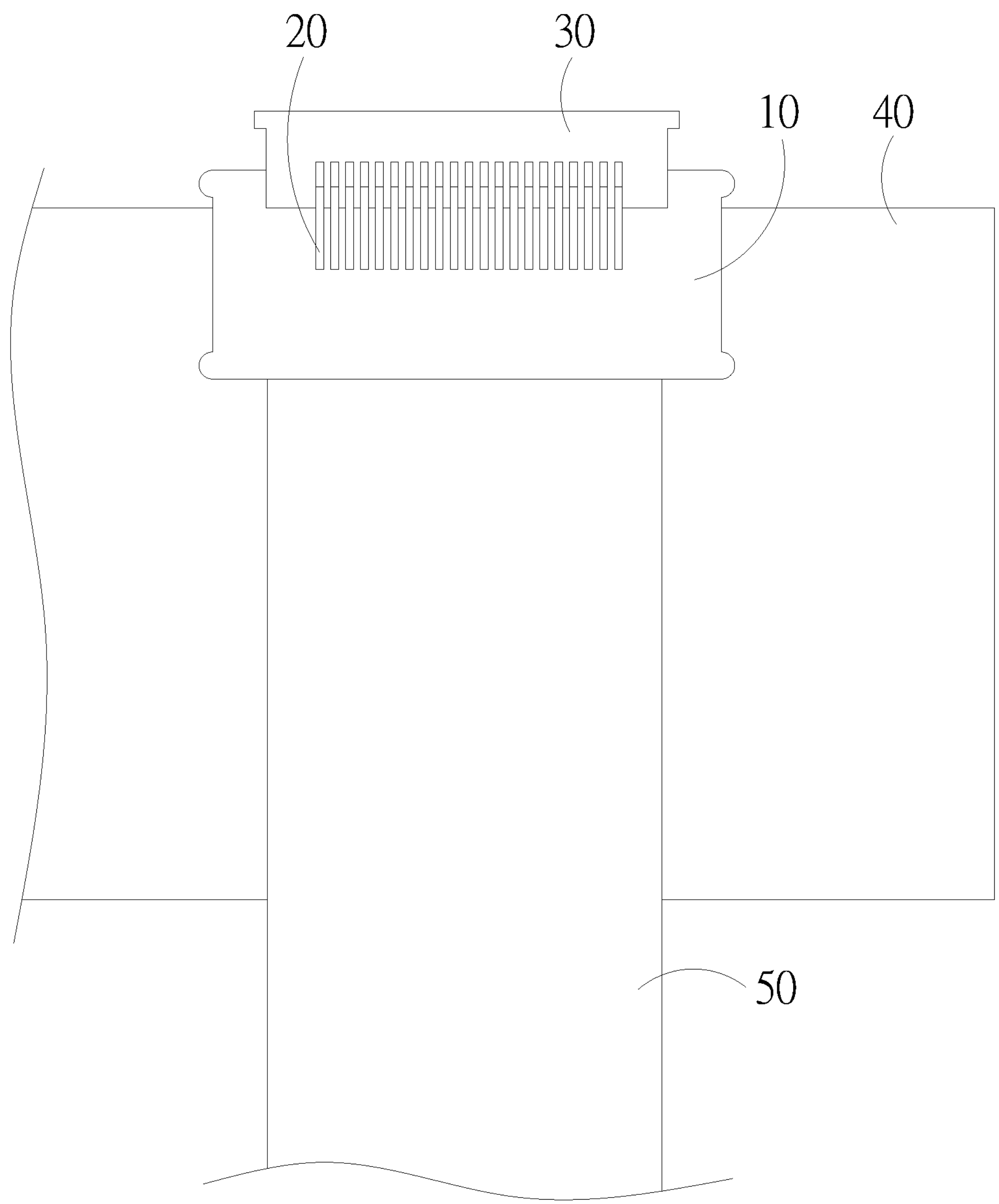
FIG. 4 is a state diagram of the fixture element of the present invention.

Please refer to FIG. 4, illustrating the state diagram of the fixture element of the present invention. As indicated in the drawing, one side or end of the connecting body 10 is further provided with a fixture element 30, and the fixture element 30 and the conductive terminal 20 are connected to each other so that the conductive terminal 20 is fastened or loosened by a linkage made by the fixture element 30 through the fixture element 30 performing an open or close action. To be more precise, when the fixture element 30 performs the open action, the conductive terminal 20 will become loosened because of the continuous action (i.e. linkage). By contrast, when the fixture element 30 performs the close action, the conductive terminal 20 will become fastened because of the continuous action (i.e. linkage). Thus, when the conductive terminal 20 performs the action of fastening, the first conductive part 21 will be squeezed toward the inside of the first accommodating space 11, whereas the second conductive part 22 will be squeezed toward the inside of the second accommodating space 12 to further fasten the PCB 40 through the first protruding part 211 and fasten the ribbon cable connecting portion 51 through the second protruding part 221.

Please refer to FIG. 5 to FIG. 8, illustrating the state diagram of each embodiment of the connecting part of the present invention. As indicated in the drawings, one side or end of the connecting body 10 further has a connecting part 13, and the connecting part 13 and the PCB 40 are connected to each other to effectively fix the connecting body 10 to one side of the PCB 40. However, this connecting method can be realized in many ways, so the following descriptions are explained in detail with embodiments exemplified along with each drawing.

Figure 5:
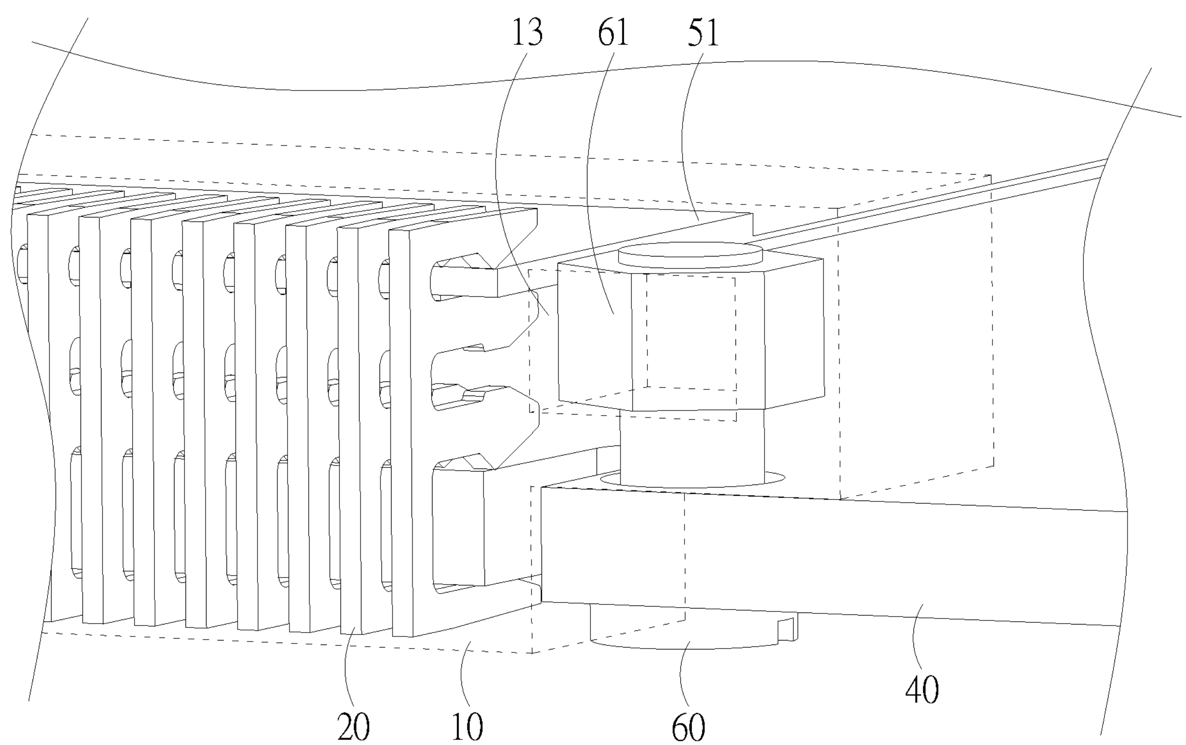
FIG. 5 is a state diagram of the first embodiment of the connecting part of the present invention (tightened with a screw and a nut).

As indicated in FIG. 5, the connecting method is realized by using a screw 60 and a nut 61 tightened together, and the PCB 40 and the connecting part 13 are clipped between the screw 60 and the nut 61 to effectively achieve the function of connection. That is to say, when the connecting part 13 and one side of the PCB 40 are attached to each other, the position where the connecting part 13 and the PCB 40 are attached can be penetrated by the screw 60. Afterwards, when the nut 61 is tightened from the tail end of the screw 60, the connecting body 10 and the PCB 40 can effectively be connected to each other.

Figure 6:
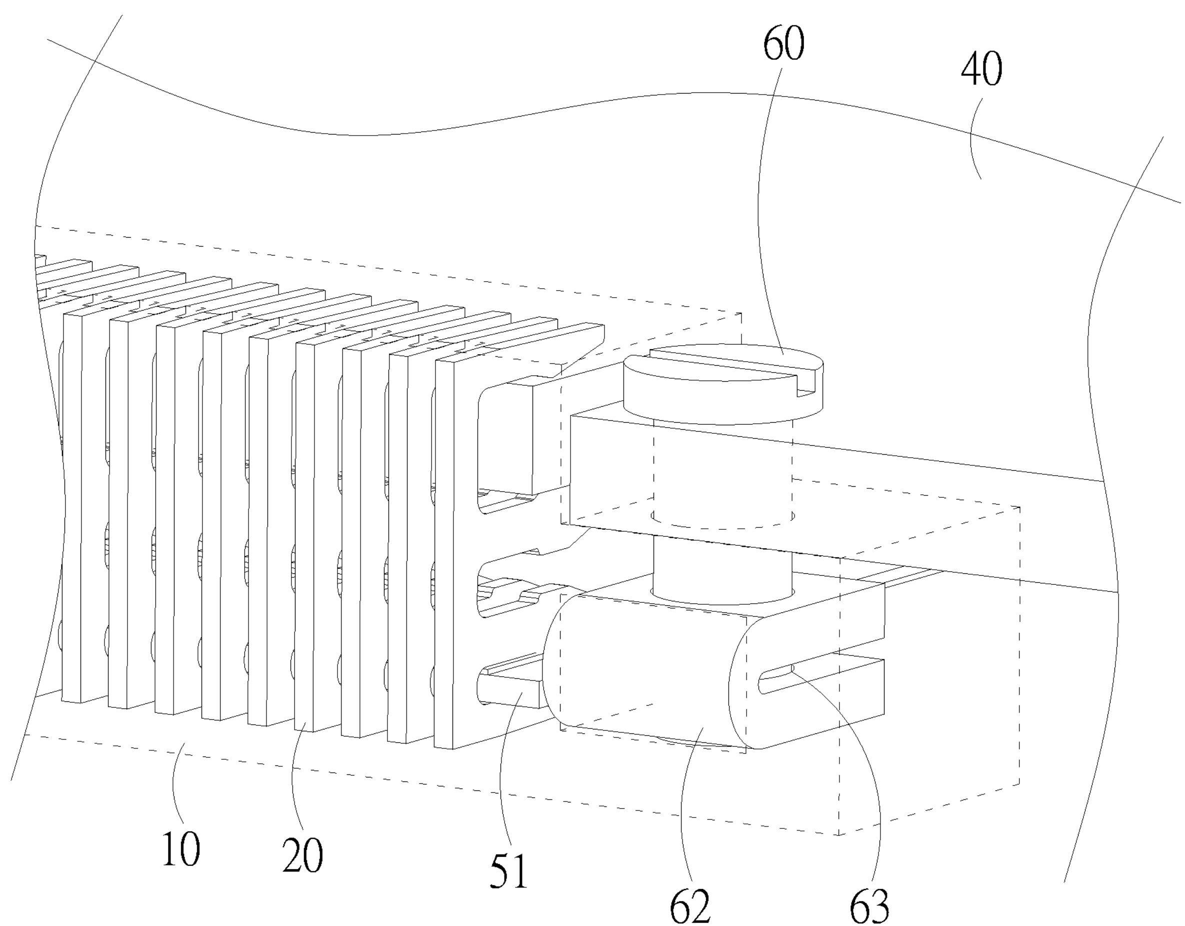
FIG. 6 is a state diagram of the second embodiment of the connecting part of the present invention (tightened with a screw and a tapping piece).

In addition, as indicated in FIG. 6, it is clear to see from the drawing that the element tightened with the screw 60 is not only limited to the nut 61. If the nut 61 is replaced with a tapping piece 62 and then a tapping part 63 of the tapping piece 62 is tightened with the screw 60, the connecting body 10 can also be effectively connected to the PCB 40.

Figure 7:
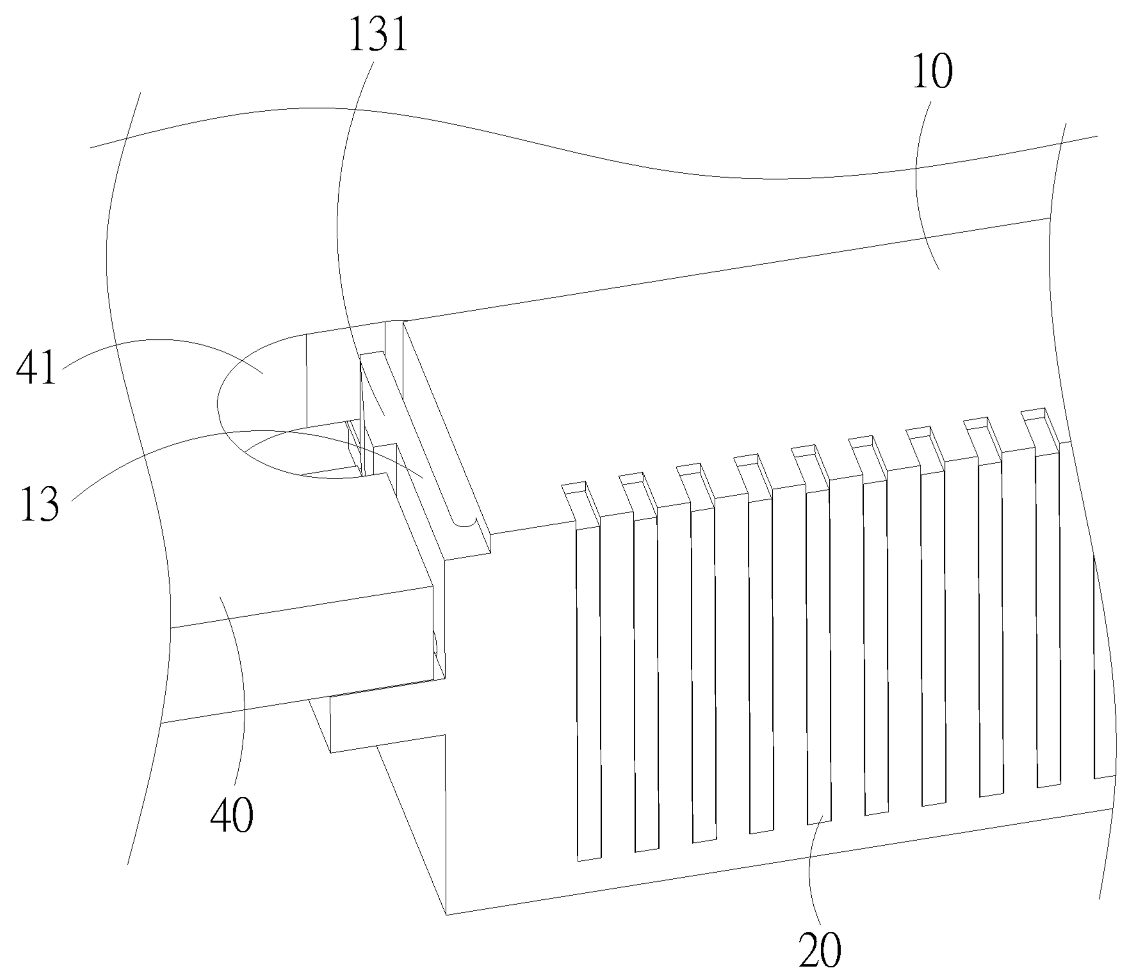
FIG. 7 is a state diagram of the third embodiment of the connecting part of the present invention (tightened by clamping).

Please refer to FIG. 7. Apart from the connecting method mentioned above, a commonly known method called clamping can also be used to connect the connecting body 10 and the PCB 40 together. To be more precise, the connecting part 13 provided in one side of the connecting body 10 has a buckling part 131, and the PCB 40 has a buckled part 41 disposed in a position where the PCB 40 and the connecting body 10 are connected . Moreover, the connecting part 13 is extended to a face of the PCB 40 to be attached with the PCB 40. In doing so, the connecting body 10 can be connected to the PCB 40 after the buckling part 131 and the buckled part 41 are clamped together.

Figure 8:
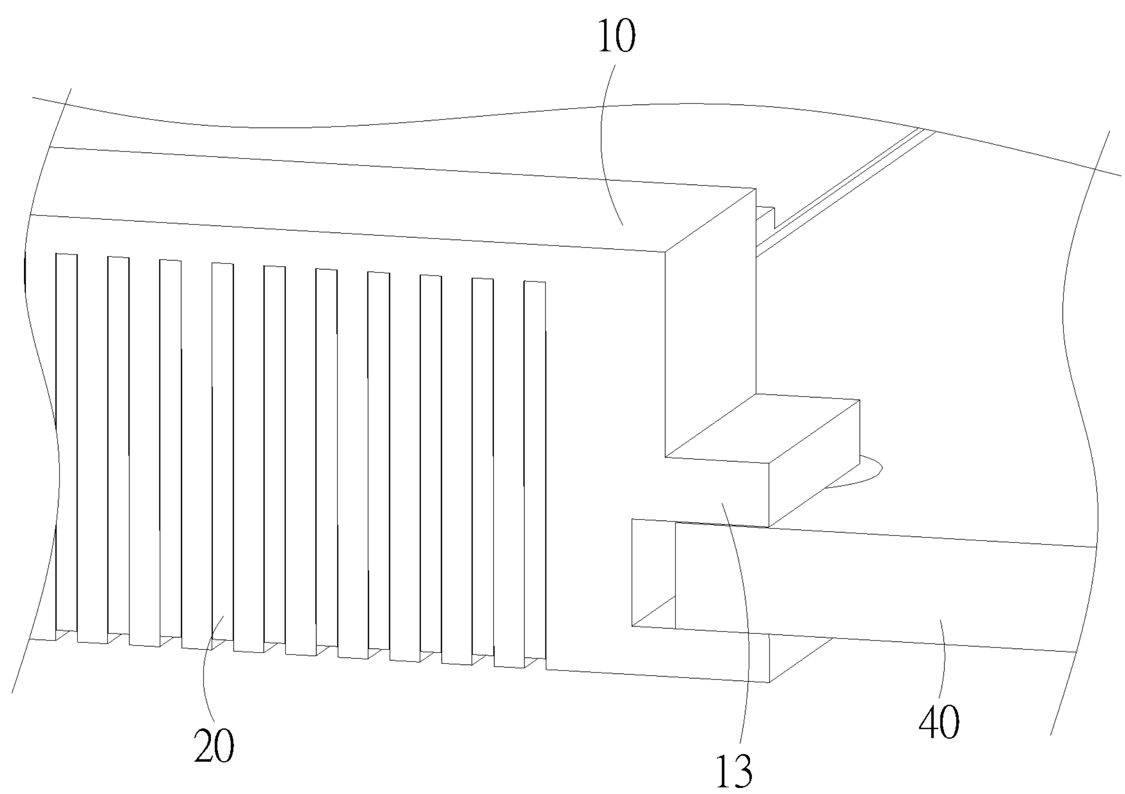
FIG. 8 is a state diagram of the fourth embodiment of the connecting part of the present invention (tightened by gripping).

Please refer to FIG. 8. The connecting body 10 can also be connected to the PCB 40 by gripping. Likewise, the connecting part 13 is in a "C" shape, and one side of the PCB 40 can be inserted into the direction of the opening to be engaged with the connecting body 10. Therefore, from the above embodiments, it can be known that various connecting methods for connecting the connecting body 10 with the PCB 40 can be realized, so the connecting methods should be unlimited.

Figure 9:
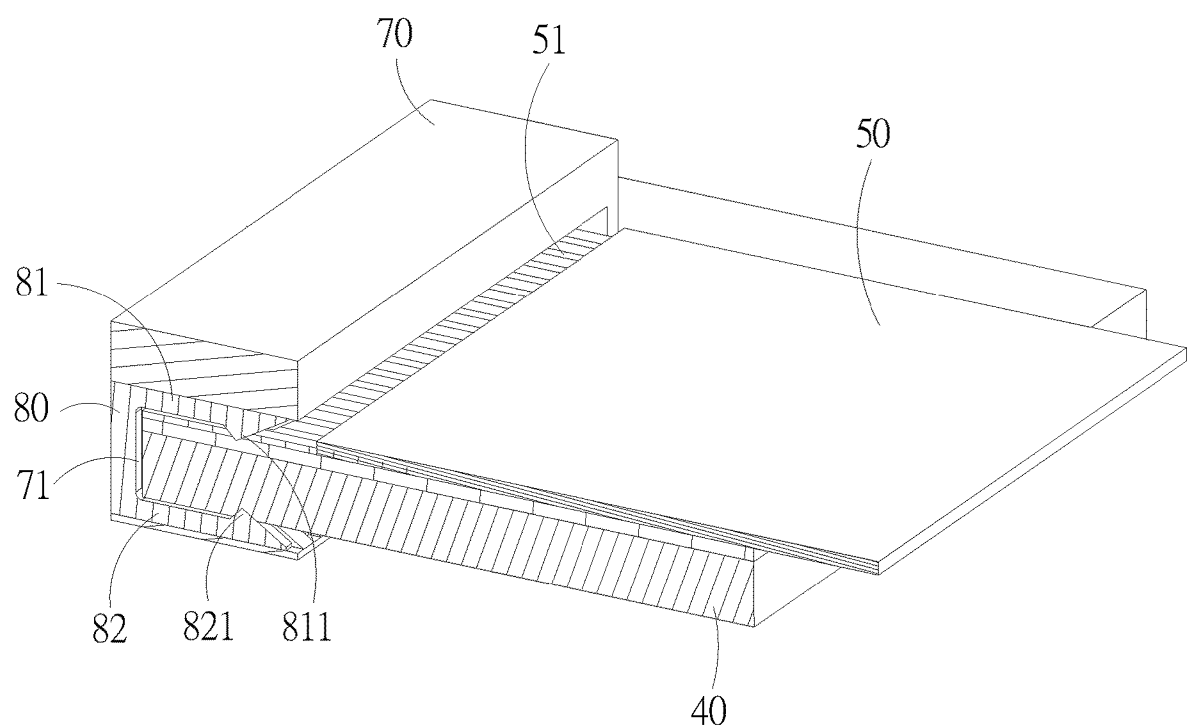
FIG. 9 is a state diagram of the fourth embodiment of the present invention.

Please refer to FIG. 9, illustrating the state diagram of the fourth embodiment of the present invention. As indicated in the drawing, the present invention can provide the other type of a simple connector structure, including a connecting body 70. Any side or end of the connecting body 70 has an accommodating space 71. The accommodating space 71 is matched with the thickness of the PCB 40 and the ribbon cable body 50 overlapping each other. The accommodating space 71 is also matched with a ribbon cable connecting portion 51 provided in the ribbon cable body 50. The inside of the connecting body 70 is provided with a conductive terminal 80, and one side of the conductive terminal 80 is extended to have one first conductive part 81 and one second conductive part 82. The first conductive part 81 and the second conductive part 82 are extended to be disposed on any side or end of the accommodating space 71. One side of the first conductive part 81 has a first protruding part 811. The first protruding part 811 provided in the first conductive part 81 is attached with the ribbon cable connecting portion 51. One side of the second conductive part 82 has a second protruding part 821. The second protruding part 821 provided in the second conductive part 82 is attached with the PCB 40. The first protruding part 811 and the second protruding part 821 are located at a relative position of the up and down side or left and right side of the PCB 40 and the ribbon cable body 50 overlapping each other to fasten the position where the PCB 40 and the ribbon cable body 50 overlap.

It can be known from the above-mentioned structure that the PCB 40 and the ribbon cable body 50 can be accommodated in the accommodating space 71, and then the PCB 40 and the ribbon cable body 50 can be gripped together by the first protruding part 811 and the second protruding part 821 to tighten the PCB 40 and the ribbon cable body 50 and achieve electric conductance with the conductive terminal 80.

However, what is mentioned above is only the optimal embodiment of the present invention, which cannot be limited by the scope of the present invention. Therefore, simple equivalent changes and modifications which are made in accordance with the claims of the invention and the contents of the specification are still within the scope of the present invention.

What is claimed is:

1. A simple electrical connector structure connecting a ribbon cable and a printed circuit board, comprising:

a connecting body, wherein any side or end of the connecting body has a first accommodating space and a second accommodating space, any side or end of the first accommodating space is provided with at least one first conductive part, and any side or end of the second accommodating space is provided with at least one second conductive part electrically conducted to the at least one first conductive part, wherein the first accommodating space and the second accommodating space are different in height such that the first accommodating space matches with the printed circuit board and the second accommodating space matches with the ribbon cable.

2. The simple electrical connector structure according to claim 1, wherein an inside of the connecting body is provided with a conductive terminal comprising the at least one first conductive part and the at least one second conductive part, the at least one first conductive part is extended to be disposed on any side or end of the first accommodating space, and the at least one second conductive part is extended to be disposed on any side or end of the second accommodating space.

3. The simple electrical connector structure according to claim 2, wherein one side of the at least one first conductive part has at least one first protruding part, and a printed circuit board (PCB) is engaged with the at least one first conductive part by the first protruding part.

4. The simple electrical connector structure according to claim 3, wherein one side of the at least one second conductive part has at least one second protruding part, and a ribbon cable body is engaged with the at least one second conductive part by the second protruding part.

5. The simple electrical connector structure according to claim 2, wherein any side or end of the connecting body is further provided with a fixture element, and the fixture element and the conductive terminal are connected to each other so that the conductive terminal is fastened or loosened by a linkage made by the fixture element through the fixture element performing an open or close action.

6. The simple electrical connector structure according to claim 5, wherein any side or end of the connecting body further has a connecting part, and the connecting part and the PCB are connected to each other to fix the connecting body to one side of the PCB.

7. The simple electrical connector structure according to claim 6, wherein the connecting part is tightened with a screw and a nut, with a screw and a tapping piece, by clamping, or by gripping to be connected to the PCB.

8. The simple electrical connector structure according to claim 6, wherein the connecting body is an insulating connecting body.

9. A simple electrical connector structure connecting a ribbon cable and a printed circuit board, comprising:

a connecting body, wherein any side or end of the connecting body has an accommodating space, any side or end of the accommodating space is provided with at least one first conductive part and at least one second conductive part electrically connecting to the first conductive part, one side of the at least one first conductive part has a first protruding part, one side of the at least one second conductive part has a second protruding part, and the first protruding part and the second protruding part are located at the up and down side or left and right side of the accommodating space, wherein the accommodating space having a height matching with a combined thickness of the ribbon cable and the printed circuit board overlapping each other.

10. The simple electrical connector structure according to claim 9, wherein an inside of the connecting body is provided with a conductive terminal, and the conductive terminal is extended to have the at least one first conductive part and the at least one second conductive part.

11. The simple electrical connector structure according to claim 10, wherein any side or end of the connecting body is further provided with a fixture element, and the fixture element and the conductive terminal are connected to each other so that the conductive terminal is fastened and loosened by a linkage made by the fixture element through the fixture element performing an open or close action.

12. The simple electrical connector structure according to claim 10, wherein any side or end of the connecting body further has a connecting part, and the connecting part and a PCB are connected to each other to fix the connecting body to one side of the PCB.

13. The simple electrical connector structure according to claim 12, wherein the connecting part is tightened with a screw and a nut, with a screw and a tapping piece, by clamping, or by gripping to be connected to the PCB.

* * * * *